United States Patent
Ogawa

(10) Patent No.: US 6,803,595 B2
(45) Date of Patent: Oct. 12, 2004

(54) SOLID SENSOR

(75) Inventor: Masaharu Ogawa, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 155 days.

(21) Appl. No.: 10/305,397

(22) Filed: Nov. 27, 2002

(65) Prior Publication Data
US 2003/0098427 A1 May 29, 2003

(30) Foreign Application Priority Data
Nov. 27, 2001 (JP) ........................................ 2001-360929

(51) Int. Cl.⁷ .......................... G01N 23/04; G01T 1/24
(52) U.S. Cl. ....................................... 250/591; 250/580
(58) Field of Search ................................ 250/591, 580, 250/370.01, 370.08, 370.09, 370.11, 370.12; 378/25, 31, 28; 430/56, 57.8, 58.1, 59.1

(56) References Cited

U.S. PATENT DOCUMENTS

| 6,268,614 | B1 | | 7/2001 | Imai |
| 6,455,867 | B2 | * | 9/2002 | Ogawa .................. 250/580 |
| 6,501,089 | B1 | * | 12/2002 | Kuwabara ............... 250/591 |
| 6,566,676 | B1 | * | 5/2003 | Kuwabara ............... 250/591 |
| 6,617,604 | B2 | * | 9/2003 | Imai ....................... 250/591 |
| 6,707,059 | B1 | * | 3/2004 | Ogawa .................... 250/591 |

FOREIGN PATENT DOCUMENTS

| EP | 1041400 A2 | 10/2000 |
| EP | 1041401 A2 | 10/2000 |

* cited by examiner

Primary Examiner—Constantine Hannaher
Assistant Examiner—Otilia Gabor
(74) Attorney, Agent, or Firm—Sughrue Mion, PLLC

(57) ABSTRACT

The reading side conductive layer of a solid sensor is provided with a photo-charged pair generating electrode formed by a plurality of linear electrodes and a photo-charged pair non-generating electrode formed by a plurality of linear electrodes arranged alternately with the linear electrodes of the photo-charged pair generating electrode. The linear electrodes of the photo-charged pair generating electrode are connected to a read-out apparatus, which reads out the latent image charge. The linear electrodes of the photo-charged pair generating electrode forming one pixel are provided with a bypass connection which, when a part of the linear electrodes is broken, allows outputs of the part of the broken linear electrode on the side of the broken part remote from the read-out apparatus to be detected by the read-out apparatus bypassing the broken part of the linear electrode.

4 Claims, 2 Drawing Sheets

SOLID SENSOR

BACKGROUND OF THE INVENTION

1. Field of the Invention

This invention relates to a solid sensor provided with a charge accumulating portion which accumulates electric charges as a latent image charge in amounts depending upon the amounts of radiation to which parts thereof are exposed.

2. Description of the Related Art

There have been proposed various image information recording and read-out apparatuses in which a solid sensor which once accumulates in its charge accumulating portion electric charges corresponding to detected amounts of radiation representing a radiation image of an object as a latent image charge and outputs an electric signal representing the radiation image of the object on the basis of the latent image charge is employed. Among various types of solid sensors employed in such image information recording and read-out apparatuses, there have been known those of an optical read-out system in which the latent image charge is read out by projecting reading light (reading electromagnetic wave).

We have proposed an optical read-out solid sensor in which high-response read-out is compatible with high signal fetch efficiency, for instance, in U.S. Pat. No. 6,268,614, European Laid-open Nos. 1 041 400 and 1 041 401. The optical read-out solid sensor comprises a first conductive layer which is permeable to recording radiation or light excited by the recording radiation (will be referred to as "the recording light", hereinbelow), a recording photoconductive layer which exhibits conductivity upon exposure to the recording light, a charge transfer layer which behaves like a substantially insulating material to an electric charge in the same polarity as that in which the first conductive layer is charged and behaves like a substantially conductive material to the electric charge in the polarity opposite to that in which the first conductive layer is charged, a reading photoconductive layer which exhibits conductivity upon exposure to reading light (reading electromagnetic wave) and a second conductive layer permeable to the reading light which are superposed one on another in this order, the signal charges (latent image charges) representing image information being accumulated in a charge accumulating portion formed in an interface between the recording photoconductive layer and the charge transfer layer.

In the solid sensor disclosed in European Laid-open Nos. 1 041 400 and 1 041 401, the electrode for the second conductive layer is in the form of a stripe electrode (a photo-charged pair generating electrode) comprising a plurality of linear electrodes each permeable to the reading light and a sub-stripe electrode (a photo-charged pair non-generating electrode) which is for outputting an electric signal whose level changes with the amount of latent image charge accumulated in the charge accumulating portion and comprises a plurality of linear electrodes is provided in the second conductive layer so that the linear electrodes of the stripe electrode and the linear electrodes of the sub-stripe electrode are alternately disposed in parallel to each other.

When a sub-stripe electrode comprising a plurality of linear electrodes is thus provided in the second conductive layer, another capacitor is formed between the charge accumulating portion and the sub-strip electrode, and it becomes feasible to give the sub-stripe electrode transfer charges of a polarity opposite to that of the latent image charge, accumulated in the charge accumulating portion by the recording light, by charge rearrangement upon reading, whereby the amount of transfer charge to be distributed to the capacitor, formed between the charge accumulating portion and the stripe electrode, through the reading photoconductive layer can be reduced as compared with when the sub-stripe electrode is not provided. As a result, the amount of signal charge to be taken out from the solid sensor can be increased, whereby the reading efficiency can be improved, and high-response read-out can be compatible with high signal fetch efficiency.

However, the solid sensor provided with such a stripe electrode and a sub-stripe electrode gives rise to a problem that when, for instance, a part of the linear electrodes of the stripe electrode is broken, it becomes impossible to read out signals from the part of the broken linear electrode in the area remoter from the image information recording and read-out apparatus than the broken part. When a part of the linear electrodes of the sub-stripe electrode is broken, it becomes impossible to accurately read out signals from the part of the broken linear electrode in the area nearer to the image information recording and read-out apparatus than the broken part.

SUMMARY OF THE INVENTION

In view of the foregoing observations and description, the primary object of the present invention is to provide a solid sensor provided with linear electrodes which allows all the accumulated charge to be read out even if a part of the linear electrodes is broken.

In accordance with a first aspect of the present invention, there is provided a solid sensor comprising a first conductive layer permeable to recording light, a recording photoconductive layer exhibiting conductivity upon exposure to the recording light, a charge accumulating portion which accumulates as a latent image charge electric charges in an amount corresponding to the amount of the recording light to which the recording photoconductive layer is exposed, a reading photoconductive layer exhibiting conductivity upon exposure to reading light, and a second conductive layer provided with a photo-charged pair generating electrode formed by a plurality of linear electrodes permeable to the reading light and a photo-charged pair non-generating electrode formed by a plurality of linear electrodes arranged alternately with the linear electrodes of the photo-charged pair generating electrode, which layers are superposed one on another in this order, the linear electrodes of the photo-charged pair generating electrode being connected to a read-out apparatus, which reads out the latent image charge, so that outputs of the linear electrodes of the photo-charged pair generating electrode forming one pixel are synthesized and detected by the read-out apparatus, wherein the improvement comprises that the linear electrodes of the photo-charged pair generating electrode forming one pixel are provided with a bypass connection which, when a part of the linear electrodes is broken, allows outputs of the part of the broken linear electrode on the side of the broken part remote from the read-out apparatus to be detected by the read-out apparatus bypassing the broken part of the linear electrode.

In accordance with a second aspect of the present invention, there is provided a solid sensor comprising a first conductive layer permeable to recording light, a recording photoconductive layer exhibiting conductivity upon exposure to the recording light, a charge accumulating portion which accumulates as a latent image charge electric charges in an amount corresponding to the amount of the recording light to which the recording photoconductive layer is exposed, a reading photoconductive layer exhibiting conductivity upon exposure to reading light, and a second conductive layer provided with a photo-charged pair generating electrode formed by a plurality of linear electrodes permeable to the reading light and a photo-charged pair non-generating electrode formed by a plurality of linear electrodes arranged alternately with the linear electrodes of the photo-charged pair generating electrode, which layers are superposed one on another in this order, the linear electrodes of the photo-charged pair non-generating electrode being connected to a read-out apparatus, which reads out the latent image charge, so that outputs of the linear electrodes of the photo-charged pair non-generating electrode forming one pixel or a plurality of pixels are synthesized and detected by the read-out apparatus, wherein the improvement comprises that the linear electrodes of the photo-charged pair non-generating electrode are provided with a bypass connection which, when a part of the linear electrodes is broken, allows outputs of the part of the broken linear electrode on the side of the broken part remote from the read-out apparatus to be detected by the read-out apparatus bypassing the broken part of the linear electrode.

The "solid sensor" of the present invention may be further provided with another or other layers and/or a micro conductive member (micro plate) so long as it comprises a first conductive layer, a recording photoconductive layer, a reading photoconductive layer and a second conductive layer superposed one on another in this order with a charge accumulating portion formed between the recording photoconductive layer and the reading photoconductive layer.

The charge accumulating portion may be formed in various ways. For example, the charge accumulating portion may be formed in an interface between a charge transfer layer and the recording photoconductive layer as disclosed in U.S. Pat. No. 6,268,615 and European Laid-open No. 1 041 400, may be formed in a trap layer or an interface between a trap layer and the recording photoconductive layer as disclosed, for instance, in U.S. Pat. No. 4,535,468, or may be formed by providing a micro conductive member which accumulates the latent image charges as disclosed in European Laid-open No. 1 041 401.

The "photo-charged pair generating electrode formed by a plurality of linear electrodes permeable to the reading light" means an electrode which allows the reading light to reach the reading photoconductive layer passing therethrough, thereby generating photo-charged pairs in the reading photoconductive layer. The "photo-charged pair non-generating electrode" is an electrode for outputting an electric signal at a level depending on the amount of the latent image charge accumulated in the charge accumulating portion. Though it is preferred that the photo-charged pair non-generating electrode be impermeable to the reading light, it need not be impermeable to the reading light in the case where a light-shielding layer impermeable to the reading light is disposed between the photo-charged pair generating electrode and the reading light projecting means. The expression "impermeable to the reading light" should be broadly interpreted "substantially impermeable to the reading light" where though the reading light can slightly pass through the light-shielding layer or the photo-charged pair non-generating electrode, the amount of photo-charged pairs generated by the reading light passing therethrough is negligible. That is, the photo-charged pairs generated in the reading photoconductive layer may include to some extent those generated by small amount of reading light.

The reading light may be any light or radiation so long as it makes it feasible to transfer the electric charges through the solid sensor so that the latent image can be electrically read out.

"The linear electrodes of the photo-charged pair generating electrode forming one pixel" or "the linear electrodes of the photo-charged pair non-generating electrode forming one pixel or a plurality of pixels" means linear electrodes which contribute to detection of signals representing one pixel or more pixels as seen in a direction perpendicular to the longitudinal direction of the linear electrodes.

In the solid sensor in accordance with the present invention, the photo-charged pair generating electrode and the photo-charged pair non-generating electrode of the second conductive layer are generally spaced from each other in the direction in which the layers are superposed and an insulating layer may be interposed between the photo-charged pair generating electrode and the photo-charged pair non-generating electrode of the second conductive layer.

The solid sensor of the present invention may be applied to the known recording method, the known reading method and the known image information recording and read-out apparatus such as disclosed in Japanese Unexamined Patent Publication No. 2000-284056 without modification of them.

In the solid sensor of the present invention, even if a part of the linear electrodes is broken, outputs of the part of the broken linear electrode on the side of the broken part remote from the read-out apparatus can be detected bypassing the broken part of the linear electrode by the read-out apparatus through the bypass connection, whereby adverse affect of breaking of the linear electrodes can be minimized.

DETAILED DESCRIPTION OF THE INVENTION

Figure 1A:
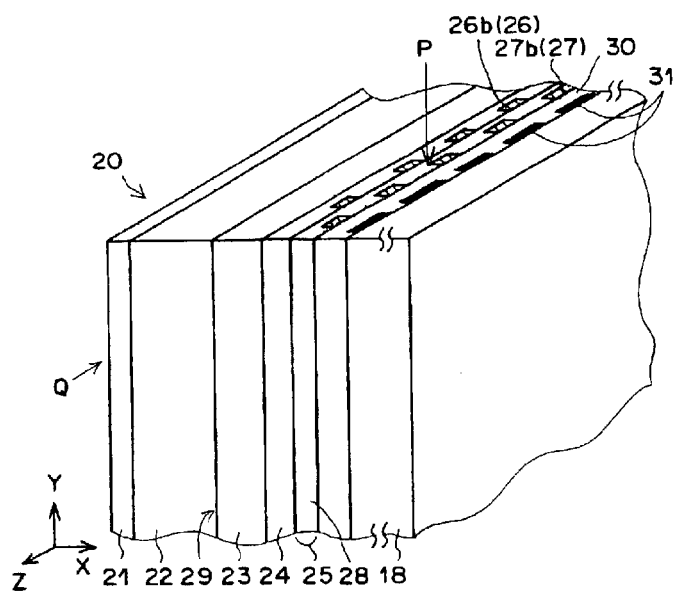
FIG. 1A is a perspective view of a solid sensor in accordance with a first embodiment of the present invention.
Figure 1B:
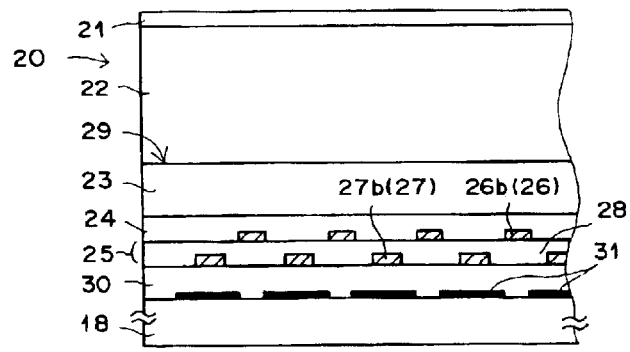
FIG. 1B is an X-Z cross-section of the part of the solid sensor denoted by arrow Q.
Figure 1C:
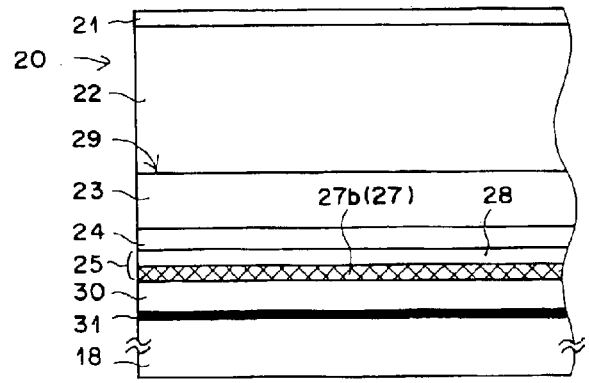
FIG. 1C is an X-Y cross-section of the part of the solid sensor denoted by arrow P.

As shown in FIGS. 1A to 1C, a solid sensor 20 in accordance with an embodiment of the present invention comprises a first conductive layer 21 permeable to recording light, a recording photoconductive layer 22 which generates charged pairs upon exposure to the recording light passing through the first conductive layer 21, thereby exhibiting conductivity, a charge transfer layer 23 which behaves like a substantially insulating material to the electric charge of a latent image polarity (e.g., a negative charge) and behaves like a substantially conductive material to the electric charge (e.g., a positive charge) of the polarity opposite to the latent image polarity, a reading photoconductive layer 24 which generates charged pairs upon exposure to the reading light, thereby exhibiting conductivity, a second conductive layer 25 provided with a photo-charged pair generating electrode 26 and a photo-charged pair non-generating electrode 27, an insulating layer 30 permeable to the reading light, and a support 18 permeable to the reading light which are superposed one on another in this order. A charge accumulating portion 29 which accumulates electric charges of the latent image polarity generated in the recording photoconductive layer 22 is formed at the interface between the recording photoconductive layer 22 and the charge transfer layer 32.

The support 18 may be of a glass plate which is transparent to the reading light. Preferably the material of the support 18 is substantially the same as the material of the reading photoconductive layer 24. For example, when the reading photoconductive layer 24 is of a-Se (amorphous selenium), it is preferred that the support 18 is of a material whose thermal expansion coefficient is 1.0 to $10.0 \times 10^{-5}$/K@40° C. taking into account that the thermal expansion coefficient of Se is $3.68 \times 10^{-5}$/K@40° C. More preferably the support 18 is of a material whose thermal expansion coefficient is 4.0 to $8.0 \times 10^{-5}$/K@40° C. For example, an organic polymer material such as polycarbonate or polymethyl methacrylate (PMMA) may be used. With this arrangement, the support 18 as a base plate and the reading photoconductive layer (Se film) 24 can be matched with each other in thermal expansion so that failure due to the difference in thermal expansion coefficient, e.g., breakage of the reading photoconductive layer 24 and/or the support 18 and/or peeling from each other due to thermal stress, can be avoided even if the solid sensor 20 is subjected to a large temperature change cycle, for instance, during transportation by ship in a cold country. Further, the support of an organic polymer support is stronger against impact than a glass support.

The recording photoconductive layer 22 may be formed of any material which becomes conductive upon exposure to the recording light. For example, the recording photoconductive layer 22 may be formed of a photoconductive material containing therein as a major component at least one of a-Se; lead oxide (II) or lead iodide (II) such as PbO, $PbI_2$, or the like; $Bi_{12}$ (Ge, Si) $O_{20}$; and $Bi_2I_3$/organic polymer nano-composite.

As the charge transfer layer 23, those in which the difference in mobility between negative charges accumulated in the first conductive layer 21 and positive charges is larger (e.g., not smaller than $10^2$, and preferably not smaller than $10^3$) is better, and organic compounds such as N-polyvinyl carbazole (PVK), N,N'-diphenyl-N,N'-bis(3-methylphenyl)[1,1'-biphenyl]-4,4'-diamine (TPD), and a discotheque liquid crystal; dispersion of TPD in polymer (polycarbonate, polystyrene, PUK or the like); or semiconductors such as a-Se doped with 10 to 200 ppm of Cl are suitable. Especially, organic compounds such as PVK, TPD and discotheque liquid crystals are preferred because of their insensitivity to light. Further, since those organic compounds are generally small in dielectric constant, the capacities of the charge transfer layer 3 and the reading photoconductive layer are smaller and the signal fetch efficiency upon reading is increased. That the organic compounds are insensitive to light means that they hardly exhibit conductivity upon exposure to the recording light or the reading light.

The reading photoconductive layer 24 may be suitably formed of photoconductive material which includes as its major component at least one of a-Se, Se—Te, Se—As—Te, metal-free phthalocyanine, metallophthalocyanine, MgPC (magnesium phthalocyanine), VoPc (phase II of vanadyl phthalocyanine) and CuPc (copper phthalocyanine).

The thickness of the recording photoconductive layer 22 is preferably not smaller than 50 $\mu$m and not larger than 1000 $\mu$m. When the recording photoconductive layer 22 is in the range in thickness, it can sufficiently absorb the recording light.

It is preferred that the sum of the thickness of the charge transfer layer 23 and the thickness of the reading photoconductive layer 24 be not larger than ½ of the thickness of the recording photoconductive layer 22, and the smaller the sum of the thickness of the charge transfer layer 23 and the thickness of the reading photoconductive layer 24 is (e.g., not larger than ⅒ or ¹⁄₂₀ of the recording photoconductive layer 2), the higher the reading response is.

The materials for each layer listed above by way of example are suitable for a solid sensor in which the charge transfer layer 23 is caused, by negatively charging the first conductive layer 21 with the second conductive layer 23 positively charged so that negative charges are accumulated as the charge of the latent image polarity in the charge accumulating portion 29 formed in the interface between the recording photoconductive layer 22 and the charge transfer layer 23, to function as a positive hole transfer layer where the mobility of the charge of the latent image polarity (negative) is smaller than that of the charge of the transfer polarity (positive). However, the polarities of the charges of the respective layers may be reversed by slight modification of the solid sensor such as changing the charge transfer layer which functions as a positive hole transfer layer to that which functions as an electron transfer layer.

For example, in such a case, the recording photoconductive layer 22 may be formed of a photoconductive material such as a-Se, lead oxide (II) or lead iodide (II), the charge transfer layer 23 may be formed of N-trinitrofluorenidene·aniline (TFNA) derivative, trinitrofluorenone (TNF)/polyester dispersed system, unsdiphenoquinone derivative or the like, and the reading photoconductive layer 24 may be formed of metal-free phthalocyanine or metallophthalocyanine.

Though, in this embodiment, the charge accumulating portion 29 is formed in the interface between the recording photoconductive layer 22 and the charge transfer layer 23, it may be formed as a trap layer which traps and accumulates the electric charge of the latent image polarity as disclosed in U.S. Pat. No. 4,535,468.

The first conductive layer 21 should be permeable to the recording light. For example, when the recording light is visible light, the first conductive layer 21 may be formed of metal oxide such as a nesa film ($SnO_2$), an ITO film (indium tin oxide) or an IDIOX film (Idemitsu Indium X-metal Oxide: amorphous transparent metal oxide easy to process; IDEMITSU KOUSAN) in a thickness of 50 to 200 nm and preferably in a thickness of 100 nm to 200 nm. Otherwise, pure metal such as Al, Au, Mo, and Cr in a thickness not larger than about 20 nm (preferably not larger than 10 nm) may be employed as the first conductive layer 21. When an X-ray is used as the recording light and an X-ray image is recorded on the solid sensor by exposing the solid sensor 20 to X-ray from the side of the first conductive layer 21, the first conductive layer 21 need not be transparent to visible light and accordingly, may be of, for instance, Al or Au in a thickness of 100 nm.

The second conductive layer 25 is provided with a photo-charged pair generating electrode 26 comprising a plurality of linear electrodes 26b which are permeable to the reading light and a photo-charged pair non-generating electrode 27 comprising a plurality of linear electrodes 27b which are permeable to the reading light. The linear electrodes 26b of the photo-charged pair generating electrode 26 and the linear electrodes 27b of the photo-charged pair non-generating electrode 27 are alternately disposed in parallel to each other.

Each linear electrode 26b of the photo-charged pair generating electrode 26 and a linear electrode 27b of the photo-charged pair non-generating electrode 27 adjacent to the linear electrode 26b of the photo-charged pair generating electrode 26 are paired and four adjacent pairs of linear electrodes 26b and 27b form one pixel. Four linear electrodes 26b and four linear electrodes 27b forming one pixel respectively form one element 26a and one element 27a.

The photo-charged pair generating electrode 26 and the photo-charged pair non-generating electrode 27 are spaced from each other in the direction in which the layers are superposed, and an insulating layer 28 is provided between the photo-charged pair generating electrode 26 and the photo-charged pair non-generating electrode 27.

The photo-charged pair non-generating electrode 27 is a conductive member for outputting an electric signal at a level depending on the amount of the latent image charge accumulated in the charge accumulating portion 29.

Figure 2A:
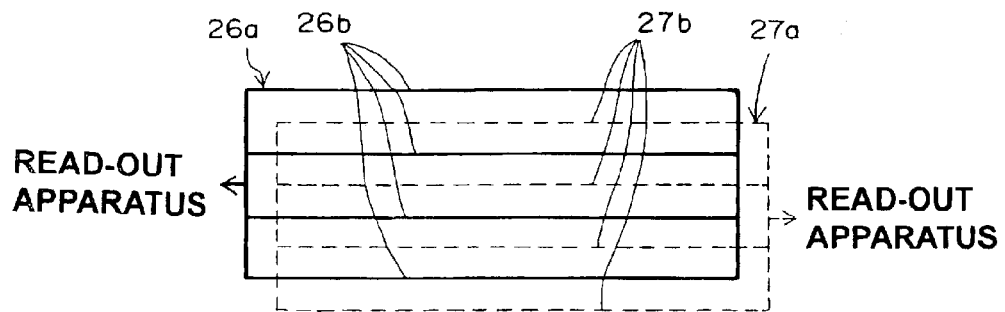
FIG. 2A is a plan view of the photo-charged pair generating electrode and the photo-charged pair non-generating electrode employed in the solid sensor.

As shown in FIG. 2A, the element 26a is formed by four linear electrodes 26b which are interconnected and connected to a read-out apparatus (not shown) at one ends thereof and are interconnected at the other ends thereof. The element 27a is formed by four linear electrodes 27b which are interconnected and connected to a read-out apparatus (not shown) at one ends thereof and are interconnected at the other ends thereof as the bypass connection. When one of the linear electrodes 26b or 27b is broken at a part thereof, the output of the part of the linear electrode on the side of the broken part remote from the read-out apparatus can be detected through the bypass connection (i.e., the other ends of the linear electrodes). As seen in plan, the linear electrodes 26b of the photo-charged pair generating electrode 26 and the linear electrodes 27b of the photo-charged pair non-generating electrode 27 are alternately disposed in parallel to each other. A part of the reading photoconductive layer 24 is interposed between each pair of adjacent linear electrodes 26b of the element 26a. The photo-charged pair generating electrode 26 and the photo-charged pair non-generating electrode 27 are electrically insulated by the insulating layer 28. The photo-charged pair generating electrode 26 and the photo-charged pair non-generating electrode 27 may be electrically insulated without use of an insulating layer, for instance, by spatially separating the photo-charged pair generating electrode 26 and the photo-charged pair non-generating electrode 27.

Though, in this embodiment, one pixel is formed by four linear electrodes, one pixel may be formed by two, three, five or more linear electrodes. Further, the elements 26a and 27a may be formed of different number of linear electrodes.

Since the elements 27a of the photo-charged pair non-generating electrode 27 are connected to the read-out apparatus at an electrical potential, in the case of the element 27a of the photo-charged pair non-generating electrode 27, the bypass connection may be connected between the linear electrodes in different elements 27a without limiting to between the linear electrodes in the same element 27a.

Figure 2B:
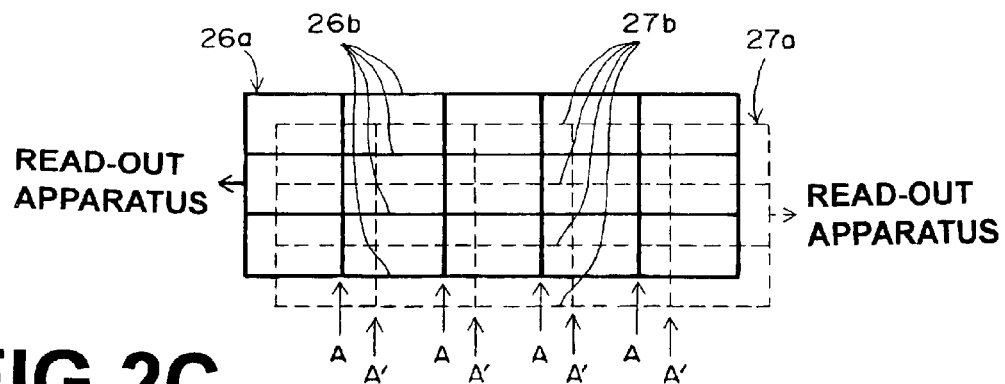
FIGS. 2B and 2C are plan views respectively for illustrating modifications of the photo-charged pair generating electrode and the photo-charged pair non-generating electrode employed in the solid sensor.
Figure 2C:
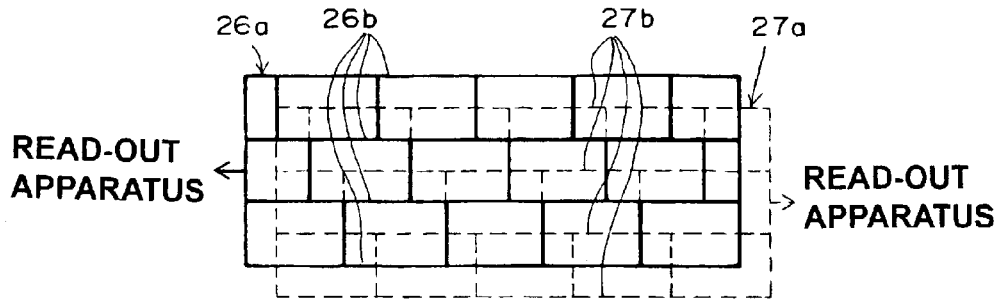

The bypass connection may be provided in a plurality of positions as shown in FIGS. 2B and 2C. That is, in the case of the electrode 26 or 27 where the bypass connection is provided only at the ends of the linear electrodes 26b or 27b opposite to the ends which are interconnected and connected to the read-out apparatus as shown in FIG. 2A, when one linear electrode is broken at two parts, the output of the part of the linear electrode between the broken parts cannot be detected.

To the contrast, when the linear electrodes 26b or 27b of the electrode 26 or 27 are interconnected at a plurality of intermediate portions denoted by arrows A or A' in FIG. 2B, the part which can be isolated from both the ends thereof by breakage of the linear electrode at two parts can be connected to the read-out apparatus through one of the intermediate bypass connections.

However, when intermediate bypass connections are provided as shown in FIG. 2B, that is, when the bypass connections between adjacent linear electrodes are aligned in a direction perpendicular to the longitudinal direction of the linear electrodes, the parts connected by the bypass connections, i.e., denoted by A or A' in FIG. 2B, can become different in sensitivity from the other parts. This problem can be suppressed by displacing the bypass connections between adjacent linear electrodes in the longitudinal direction of the linear electrodes.

The bypass connection may be provided only one of the photo-charged pair generating electrode 26 and the photo-charged pair non-generating electrode 27. Though it is preferred that all the linear electrodes be connected by way of the bypass connections, only a part of the linear electrodes may be connected by way of the bypass connections.

The material of the element 26a of the photo-charged pair generating electrode 26 may be, for instance, ITO film (indium tin oxide), IDIOX film (Idemitsu Indium X-metal Oxide: IDEMITSU KOUSAN), aluminum or molybdenum. The material of the element 27a of the photo-charged pair non-generating electrode 27 may be, for instance, aluminum, molybdenum or chromium.

A light-shielding film 31 which is relatively poor in permeability to the reading light is provided on the support 18 in a place opposite to each of the spaces between the elements 26a and 27a so that the intensity of the reading light impinging upon the element 27a is weakened as compared with that impinging upon the element 26a.

The light-shielding film 31 need not be formed of an electrically insulating material and may be not smaller than $2 \times 10^{-6} \Omega \cdot cm$ (more preferably not smaller than $1 \times 10^{15} \Omega \cdot cm$) in specific resistance. For example, the light-shielding film 31 may be formed of metal such as Al, Mo or Cr or an organic material such as $MOS_2$, $WSi_2$ or TiN. It is more preferred that the light-shielding film 31 be not smaller than $1 \Omega \cdot cm$ in specific resistance.

When the light-shielding film 31 is formed of conductive material such as metal, an insulating body should be interposed between the light shielding film 31 and the element 27a in order to prevent electric contact therebetween. The insulting layer 30 in the solid sensor 20a of this embodiment is provided between the second conductive layer 25 and the support 18 for this purpose and is formed of insulating material such as $SiO_2$. The thickness of the insulating layer 30 is preferably about 0.01 $\mu$m to 10 $\mu$m, more preferably about 0.1 $\mu$m to 1 $\mu$m, and most preferably about 0.5 $\mu$m.

In the solid sensor 20a of this embodiment, a capacitor $C_{*a}$ is formed between the first conductive layer 21 and the charge accumulating portion 29 across the recording photoconductive layer 22, a capacitor $C_{*b}$ is formed between the charge accumulating portion 29 and the photo-charged pair generating electrode 26 (the element 26a) across the charge transfer layer 23 and the reading photoconductive layer 24, a capacitor $C_{*c}$ is formed between the charge accumulating portion 29 and the photo-charged pair non-generating electrode 26 (the element 27a) by way of the reading photoconductive layer 24 and the charge transfer layer 23. The amounts of positive charge distributed to the capacitors $C_{*a}$, $C_{*b}$ and $C_{*c}$ by charge rearrangement upon reading are proportional to the capacities of the respective capacitors with the total thereof $Q_+$ equal to the amount $Q_-$ of the charge of the latent image polarity as represented by the following formulae.

$$Q_- = Q_+ = Q_{+a} + Q_{+b} + Q_{+c}$$

$$Q_{+a} = Q_+ \times C_a/(C_a + C_b + C_c)$$

$$Q_{+b} = Q_+ \times C_b/(C_a + C_b + C_c)$$

$$Q_{+c} = Q_+ \times C_c/(C_a + C_b + C_c)$$

The amount of the signal charge which can be taken out from the solid sensor 20a is equal to the sum of the amounts $Q_{+a}$ and $Q_{+c}$ of the positive charges distributed to the capacitors $C_{*a}$ and $C_{*c}$ and the positive charge distributed to the capacitor $C_{*b}$ cannot be taken out as the signal charge. See European Laid-open No. 1 041 401.

On the other hand, the ratio $C_b$:$C_c$ of the capacity $C_b$ of the capacitor $C_{*b}$ to the capacity $C_c$ of the capacitor $C_{*c}$ is equal to the ratio of the width of the element 26a to the width of the element 27a. To the contrast, the capacities $C_a$ and Cb of the capacitors $C_{*a}$ and $C_{*c}$ are hardly affected by the photo-charged pair non-generating electrode 27.

As a result, the amounts of positive charge $Q_{+b}$ distributed to the capacitors $C_{*b}$ by charge rearrangement upon reading can be reduced as compared with when the photo-charged pair non-generating electrode 27 is not provided and accordingly, the amount of signal charge to be taken out from the solid sensor 20a through the photo-charged pair non-generating electrode 27 can be increased.

Though preferred embodiments of the present invention have been described above, the present invention may be applied in various forms.

For example, though, in the solid sensors in accordance with the embodiments described above, the recording photoconductive layer exhibits conductivity upon exposure to the recording radiation, the recording photoconductive layer may exhibit conductivity upon exposure to light emitted through excitation by the recording radiation. See U.S. Pat. No. 6,268,614. For example, a wavelength conversion layer called an X-ray scintillator which converts the recording radiation to light in other wavelength regions such as blue light is formed on the surface of the first conductive layer. The wavelength conversion layer is suitably formed of cesium iodide (CsI). It is needless to say that the first conductive layer should be permeable to the light obtained by converting the recording radiation by the wavelength conversion layer.

Further, though, in the solid sensors of the embodiments described above, a charge transfer layer is formed between the recording photoconductive layer and the reading photoconductive layer and the charge accumulating portion is formed in the interface between the recording photoconductive layer and the charge transfer layer, the charge transfer layer may be replaced with a trap layer. When the charge transfer layer is replaced with a trap layer, the latent image charges are trapped by the trap layer and accumulated in the trap layer or in the interface between the trap layer and the recording photoconductive layer. A micro plate may be disposed in the interface between the trap layer and the recording photoconductive layer for each pixel.

What is claimed is:

1. A solid sensor comprising a first conductive layer permeable to recording light, a recording photoconductive layer which exhibits conductivity upon exposure to the recording light, a charge accumulating portion which accumulates as a latent image charge electric charges in an amount corresponding to the amount of the recording light to which the recording photoconductive layer is exposed, a reading photoconductive layer which exhibits conductivity upon exposure to reading light, and a second conductive layer provided with a photo-charged pair generating electrode formed by a plurality of linear electrodes permeable to the reading light and a photo-charged pair non-generating electrode formed by a plurality of linear electrodes arranged alternately with the linear electrodes of the photo-charged pair generating electrode, which layers are superposed one on another in this order, the linear electrodes of the photo-charged pair generating electrode being connected to a read-out apparatus, which reads out the latent image charge, so that outputs of the linear electrodes of the photo-charged pair generating electrode forming one pixel are synthesized and detected by the read-out apparatus, wherein the improvement comprises that the linear electrodes of the photo-charged pair generating electrode forming one pixel are provided with a bypass connection which, when apart of the linear electrodes is broken, allows outputs of the part of the broken linear electrode on the side of the broken part remote from the read-out apparatus to be detected by the read-out apparatus bypassing the broken part of the linear electrode.

2. A solid sensor as defined in claim 1 in which the photo-charged pair generating electrode and the photo-charged pair non-generating electrode of the second conductive layer are spaced from each other in the direction in which the layers are superposed and an insulating layer is interposed between the photo-charged pair generating electrode and the photo-charged pair non-generating electrode of the second conductive layer.

3. A solid sensor comprising a first conductive layer permeable to recording light, a recording photoconductive layer which exhibits conductivity upon exposure to the recording light, a charge accumulating portion which accumulates as a latent image charge electric charges in an amount corresponding to the amount of the recording light to which the recording photoconductive layer is exposed, a reading photoconductive layer which exhibits conductivity upon exposure to reading light, and a second conductive layer provided with a photo-charged pair generating electrode formed by a plurality of linear electrodes permeable to the reading light and a photo-charged pair non-generating electrode formed by a plurality of linear electrodes arranged alternately with the linear electrodes of the photo-charged pair generating electrode, which layers are superposed one on another in this order, the linear electrodes of the photo-charged pair non-generating electrode being connected to a read-out apparatus, which reads out the latent image charge, so that outputs of the linear electrodes of the photo-charged pair non-generating electrode forming one pixel or a plurality of pixels are synthesized and detected by the read-out apparatus, wherein the improvement comprises that the linear electrodes of the photo-charged pair non-generating electrode are provided with a bypass connection which, when a part of the linear electrodes is broken, allows outputs of the part of the broken linear electrode on the side of the broken part remote from the read-out apparatus to be detected by the read-out apparatus bypassing the broken part of the linear electrode.

4. A solid sensor as defined in claim 3 in which the photo-charged pair generating electrode and the photo-charged pair non-generating electrode of the second conductive layer are spaced from each other in the direction in which the layers are superposed and an insulating layer is interposed between the photo-charged pair generating electrode and the photo-charged pair non-generating electrode of the second conductive layer.

* * * * *